United States Patent
Zhu et al.

(10) Patent No.: US 8,801,946 B2
(45) Date of Patent: Aug. 12, 2014

(54) METHOD FOR MAKING GRATING

(71) Applicants: Tsinghua University, Beijing (CN);
Hon Hai Precision Industry Co., Ltd., New Taipei (TW)

(72) Inventors: Zhen-Dong Zhu, Beijing (CN);
Qun-Qing Li, Beijing (CN); Li-Hui Zhang, Beijing (CN); Mo Chen, Beijing (CN); Shou-Shan Fan, Beijing (CN)

(73) Assignees: Tsinghua University, Beijing (CN);
Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/858,191

(22) Filed: Apr. 8, 2013

(65) Prior Publication Data

US 2014/0175045 A1    Jun. 26, 2014

(30) Foreign Application Priority Data

Dec. 26, 2012 (CN) .......................... 2012 1 0571020

(51) Int. Cl.
*B29D 11/00* (2006.01)

(52) U.S. Cl.
USPC .......................................................... 216/24

(58) Field of Classification Search
CPC ........ C03C 15/00; G02B 5/1809; G02B 5/18; G02B 6/124; G02B 6/12007; G02B 6/1228; G02B 6/125; G02B 6/34; G03F 7/00; B82Y 20/00
USPC ............................................. 216/24; 359/566
See application file for complete search history.

(56) References Cited

U.S. PATENT DOCUMENTS

2005/0199582 A1*   9/2005   Miyakawa ...................... 216/24

* cited by examiner

*Primary Examiner* — Roberts Culbert
(74) *Attorney, Agent, or Firm* — Novak Druce Connolly Bove + Quigg LLP

(57) ABSTRACT

A method for making grating is provided. The method includes following steps. A substrate is provided. A mask layer is located on the substrate. The mask layer is patterned, and a number of bar-shaped protruding structures are formed on a surface of the mask layer, a slot is defined between each of two adjacent protruding structures of the number of protruding structures to expose a portion of the substrate. The protruding structures are etched so that each of two adjacent protruding structures begin to slant face to face until they are contacting each other. The exposed portion of the substrate is etched through the slot. The mask layer is removed.

19 Claims, 7 Drawing Sheets

METHOD FOR MAKING GRATING

CROSS-REFERENCE TO RELATED APPLICATIONS

This application claims all benefits accruing under 35 U.S.C. §119 from China Patent Application No. 201210571020.5, filed on Dec. 26, 2012 in the China Intellectual Property Office, disclosure of which is incorporated herein by reference.

BACKGROUND

1. Technical Field

The present disclosure relates to a method for making grating.

2. Description of Related Art

Blazed grating is an important component in modern precision instruments. The precise blazed grating especially subwavelength blazed grating is difficult to fabricate. A method for making the blazed grating usually includes etching a mask layer by photolithography. However, the cost of photolithography is expensive, the precision of the mask layer is not high, and the blazed grating fabrication process is complicated.

What is needed, therefore, is to provide a low-cost, high precision, and simple method for making the grating.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present gratings and methods for making the same.

Figure 1:
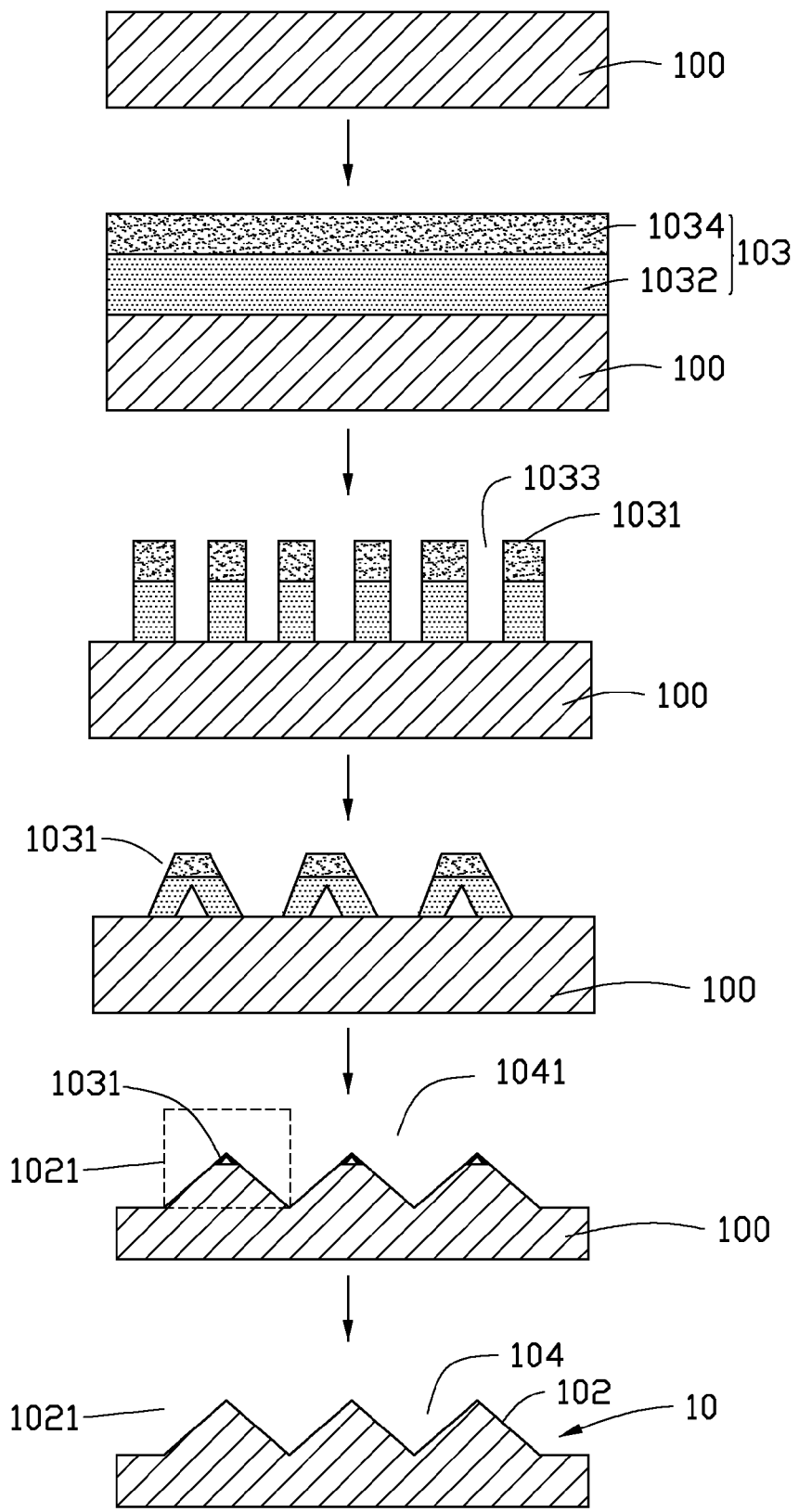
FIG. 1 shows a process of one embodiment of a method for making a grating.

Referring to FIG. 1, one embodiment of a method for making a grating 10 includes the following steps:

step (S10), providing a substrate 100;

step (S11), locating a mask layer 103 on a surface of the substrate 100;

step (S12), forming a plurality of bar-shaped protruding structures 1031 to expose a portion of the substrate 100 by patterning the mask layer 103, wherein the plurality of bar-shaped protruding structures 1031 extend along a direction substantially parallel with a surface of the substrate 100;

step (S13), etching the plurality of protruding structures 1031 so that each of two adjacent protruding structures 1031 begin to slant face to face until they are contacting each other;

step (S14), patterning the exposed portion of the substrate 100 to form a plurality of three-dimensional nano-structure preforms 1021; and step (S15), forming a plurality of three-dimensional nano-structures 102 by removing the mask layer 103.

In step (S10), the substrate 100 can be an insulative substrate or a semiconductor substrate. The substrate 100 can be made of glass, quartz, silicon (Si), silicon dioxide ($SiO_2$), silicon nitride ($Si_3N_4$), gallium nitride (GaN), gallium arsenide (GaAs), alumina ($Al_2O_3$), or magnesia (MgO). The substrate 100 can also be made of a doped material such as doped N-type GaN or P-type GaN. In one embodiment, the substrate 100 is made of silicon. A size and a thickness of the substrate 100 can be determined according to need. The substrate 100 can be cleaned in a clean room.

In step (S11), the mask layer 103 can be a single layered structure or a multi-layered structure. The thickness of the mask layer 103 can be selected according to the etching depth or the etching atmosphere. The patterned mask layer 103 formed in the following steps will have a high precision. If the mask layer 103 is a single layered structure, the material of the mask layer 103 can be ZEP520A which is developed by Zeon Corp of Japan, HSQ (hydrogen silsesquioxane), PMMA (Polymethylmethacrylate), PS (Polystyrene), SOG (silicon on glass), and other silitriangle oligomers. The mask layer 103 is used to protect a portion of the substrate 100. In one embodiment, the mask layer 103 is a multi-layered structure. The mask layer 103 includes a first mask layer 1032 and a second mask layer 1034 stacked on the substrate 100 in that order, with the second mask layer 1034 covering the first mask layer 1032. The first mask layer 1032 and the second mask layer 1034 can be selected according to need. The material of the first mask layer 1032 can be ZEP520A, PMMA, PS, SAL601, and ARZ720. The material of the second mask layer 1034 can be HSQ, SOG, and other silitriangle oligomers. The second mask layer 1034 can be easily printed by a mechanical method to ensure precision of the mask layer 103. In one embodiment, the material of the first mask layer 1032 is ZEP520A, and that of the second mask layer 1034 is HSQ. The first mask layer 1032 and the second mask layer 1034 can be formed by a screen printing method or a deposition method.

The step (S11) includes sub-steps of:

step (S111), forming the first mask layer 1032; and step (S112), forming the second mask layer 1034.

In step (S111), the first mask layer 1032 is formed by the following steps. First, the substrate 100 is cleaned in a clean room. A layer of positive electron-beam resist can be spin-coated on the substrate 100 at a speed of about 500 rounds per minute to about 6000 rounds per minute, for about 0.5 minutes to about 1.5 minutes. The positive electron-beam resist can be ZEP520A resist, which is developed by Zeon Corp of Japan. The substrate 100 with the positive electron-beam resist can be dried at a temperature of about 140 degrees centigrade to 180 degrees centigrade, for about 3 minutes to about 5 minutes, thereby forming the first mask layer 1032 on the substrate 100. The thickness of the first mask layer 1032 can be in a range of about 100 nanometers to about 500 nanometers.

In step (S111), the mask layer 1034 can be a layer of HSQ resist. The HSQ resist is spin-coated on the first mask layer 1032 under high pressure at a speed of about 2500 rounds per minute to about 7000 rounds per minute, for about 0.5 minutes to about 2 minutes. The thickness of the second mask layer 1032 can range from about 100 nanometers to about 300 nanometers. The HSQ can be pressed to deform at room temperature. Moreover, the HSQ has good structural stability, and provides a high resolution, often better than 10 nm.

Furthermore, a transition layer (not shown) can be deposited on the first mask layer 1032 before the step of forming the second mask layer 1034. In one embodiment, the transition layer can be a glassy silicon dioxide film with a thickness of about 10 nanometers to about 100 nanometers. The transition layer is used to protect the first mask layer 1032 while nanoimprinting the second mask layer 1034.

Figure 2:
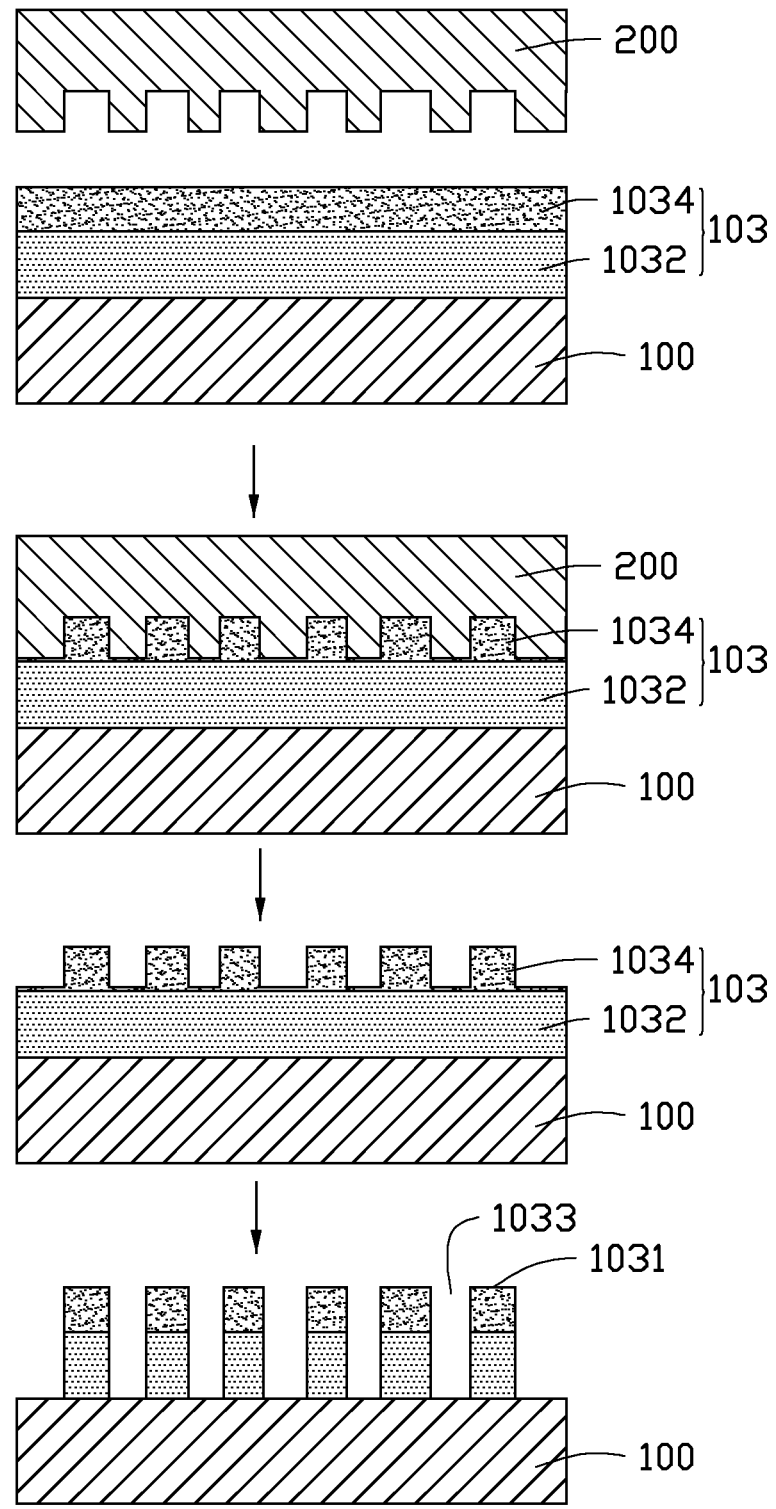
FIG. 2 shows a process of one embodiment of forming a mask layer in the method of FIG. 1.

Further referring to FIG. 2, in step (S12), the mask layer 103 can be patterned by the following steps:

step (S121), providing a patterned template 200;

step (S122), attaching the template 200 on the second mask layer 1034, and pressing and removing the template 200 to form a plurality of slots on the second mask layer 1034;

step (S123), removing the residual second mask layer 1034 in the bottom of the slot to expose the first mask layer 1032; and step (S124), patterning the mask layer 103 by removing one part of the first mask layer 1032 corresponding to the slots.

In step (S121), the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein. The template 200 includes a plurality of bar-shaped protruding structures extending along substantially the same direction. The protruding structures are substantially parallel with and spaced from each other to form an array, concentric circles, or concentric rectangles. A slot is defined between the two adjacent protruding structures. The protruding structures form the nano-pattern of the template 200. The nano-pattern can be designed according to the actual application. In one embodiment, the protruding structures are bar-shaped extending substantially along the same direction which can be defined as the X direction. The Y direction is substantially perpendicular to the X direction and substantially parallel with the surface of the substrate 100. The width of the protruding structure and that of the slot can be substantially the same. In one embodiment, both the width of the protruding structure and that of the slot range from about 50 nanometers to about 200 nanometers.

In step (S122), the template 200 is pressed towards the substrate 100 at room temperature. During this process, the protruding structures are pressed into the second mask layer 1034 to form a plurality of slots in the second mask layer 1034, and some materials of the second mask layer 1034 remain at the bottom of the slot. Finally, the template 200 is removed, with only the nano-pattern remaining in the second mask layer 1034. The nano-pattern of the second mask layer 1034 includes a plurality of second protruding structures and a plurality of slots. The protruding structures in the second mask layer 1034 correspond to the slots in the template 200. The slots in the second mask layer 1034 correspond to the protruding structures in the template 200.

In one embodiment, the template 200 is pressed towards the substrate 100 at room temperature in a vacuum environment of about $1\times10^{-1}$ millibars to about $1\times10^{-5}$ millibars. The pressure applied on the template 200 is about 2 pounds per square foot to about 100 pounds per square foot. The pressure is applied on the template 200 for about 2 minutes to about 30 minutes. There may be material of the second mask layer 1034 remaining at the bottom of the slots.

In step (S123), the residual material of the second mask layer 1034 at the bottom of the slots can be removed by plasma etching. In one embodiment, a $CF_4$ reactive plasma etching method can be used to remove the remaining material of the second mask layer 1034 at the bottom of the slots. For example, the substrate 100 with the protruding structures and the slots formed in the second mask layer 1034 can be placed in a $CF_4$ reactive plasma etching system. The $CF_4$ reactive plasma etching system generates $CF_4$ plasma, and the $CF_4$ plasma then moves towards the second mask layer 1034. The material of the second mask layer 1034 remaining at the bottom of the slots will be etched away, so that the first mask layer 1032 corresponding to the slots will be exposed. At the same time, the width of the top of the protruding structures in the second mask layer 1034 is decreased during the etching process. However, the nano-pattern in the second mask layer 1034 will be maintained.

In step (S124), the first mask layer 1032 exposed by the slots can be removed by oxygen plasma etching. For example, the substrate 100 after being treated by step (S123) can be placed in an oxygen plasma etching system. The power of the oxygen plasma etching system can in a range of about 10 watts to about 150 watts. The flow speed of the oxygen plasma can be about 2 sccm to about 100 sccm. The partial pressure of the oxygen plasma can be about 0.5 Pa to about 15 Pa. The etching time can be about 5 seconds to about 1 minute. During the process of etching the first mask layer 1032, the first mask layer 1032 exposed by the slots will be removed, and the substrate 100 corresponding to the slots will be exposed. The protruding structures in the second mask layer 1034 function as a mask to the oxygen plasma to ensure the resolution of the first mask layer 1032.

During the etching process, the pattern in the second mask layer 1034 will be copied onto the first mask layer 1032 to form a patterned mask layer 103. The patterned mask layer 103 includes a plurality of bar-shaped protruding structures 1031 on the surface of the substrate 100. Each protruding structure 1031 includes the first mask layer 1032 and the second mask layer 1034 stacked together. A slot 1033 is defined between every two adjacent protruding structures 1031, and the surface of the substrate 100 corresponding to the slot 1033 is exposed. During the process of etching the first mask layer 1032, the top of the protruding structures of the second mask layer 1034 will also be partly etched. The nano-pattern in the second mask layer 1034 can still be maintained because the speed of etching the second mask layer 1034 is much smaller than that of the first mask layer 1032. Thus, the resolution of the mask layer 103 can be improved. The plurality of protruding structures 1031 can also be formed on other base (not shown), and transferred onto the surface of the substrate 100.

In step (S13), the substrate 100 with the plurality of protruding structures 1031 can be placed in an inductively coupled plasma device to etch the plurality of protruding structures 1031 by an etching gas. The etching gas can be inert gas. The "inert gas" means that the gas cannot be reacted with the plurality of protruding structures 1031, such as Argon, Helium, Nitrogen, or any combination of them. During the etching process, each of two adjacent protruding structures 1031 begin to slant face to face, and tops of the two adjacent protruding structures 1031 gradually slant until the tops of the two adjacent protruding structures 1031 contact each other to form a protruding pair. Meanwhile, a portion of the flank on the top of the protruding structure 1031 will be gradually etched off. Therefore, a cross section of each protruding pair is triangular. In one embodiment, the cross section of each protruding pair is in a shape of isosceles triangle or trapezium. The flow speed, pressure, and etching time of the etching gas can be selected according to need. The flow speed of the etching gas ranges from about 8 sccm to about 150 sccm, the pressure of the etching gas can range from about 0.5 Pa to about 15 Pa, and the etching time can range from about 5 seconds to about 5 minutes. In one embodiment, the etching gas includes argon and oxygen. The flow speed of argon is about 28 sccm, and the flow speed of oxygen is about 32 sccm. The pressure of the etching gas is about 2 Pa, and the etching time is about 15 seconds.

In step (S14), the substrate 100 after step (S13) can be placed in an inductively coupled plasma device to etch the substrate 100 exposed by the plurality of protruding structures 1031. The etching gas can be selected according to the material of the substrate 100 and the mask layer 103. During the etching process, the surface of the substrate 100 exposed by the slots 1033 of the mask layer 103 will be etched, thereby forming a plurality of grooves in the substrate 100.

Figure 3:
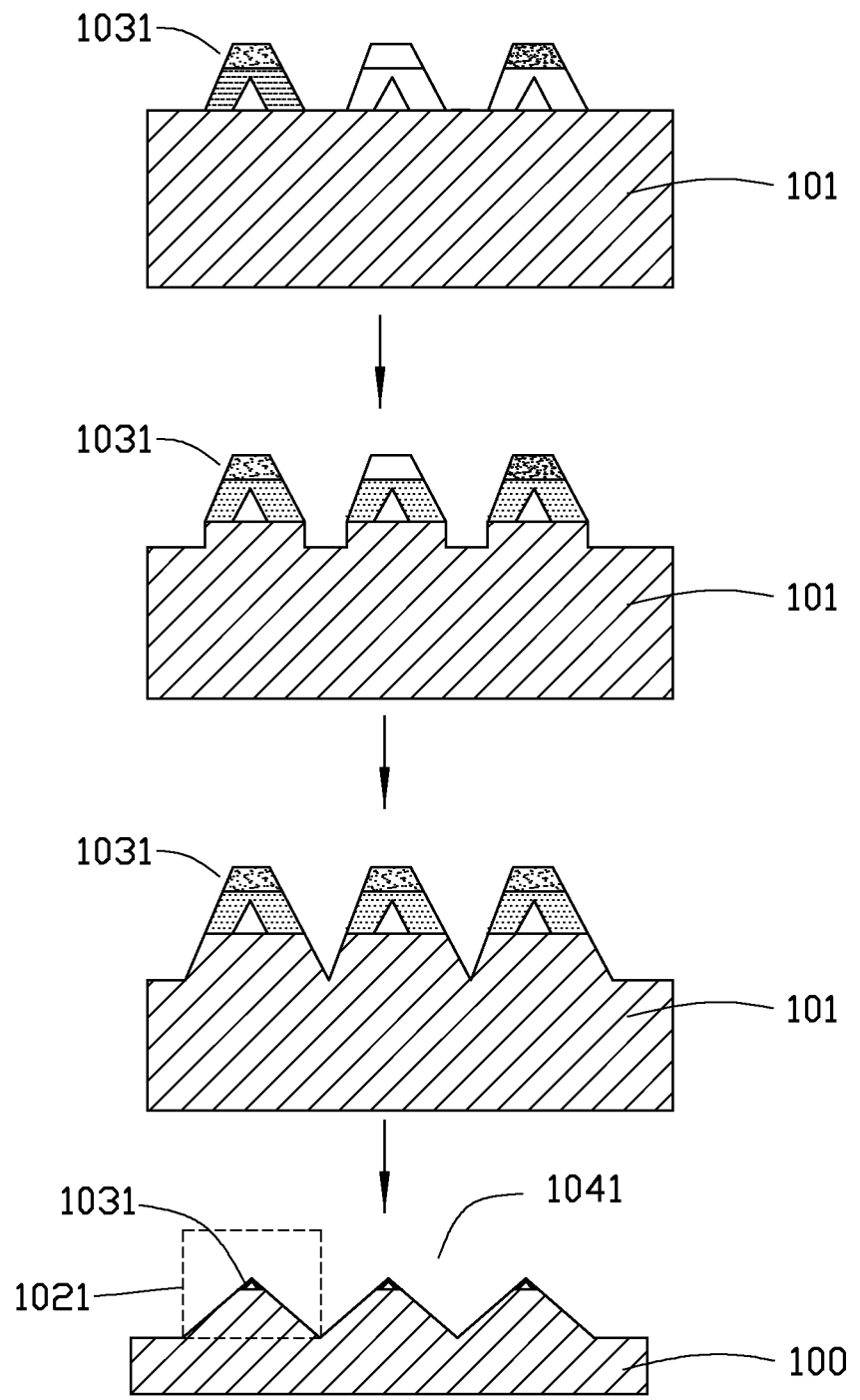
FIG. 3 shows a process of one embodiment of etching a substrate in the method of FIG. 1.

Referring to FIG. 3, the process of etching the substrate includes the following substeps:

first stage, forming a plurality of grooves with substantially the same depth by etching the surface of the substrate 100 with the etching gas;

second stage, continuing the etching process so that the size of the plurality of protruding structures 1031 is gradually reduced to continually expose the surface of the substrate 100; and third stage, forming a plurality of three-dimensional nano-structure preforms 1021 by continuing the etching process to etch the exposed surface of the substrate 100.

In the first stage, the etching gas etches the exposed surface of the substrate 100 to form a plurality of grooves. The grooves have substantially the same depth because of substantially the same etching speed.

In the second stage, during the etching process, the etching gas will react with the substrate 100 to form a protective layer. The protective layer will reduce the etching speed of the substrate 100, and the width of the grooves will slowly decrease from the outer surface of the substrate 100 to the bottom of the grooves. Thus, the inner wall of the grooves will be not absolutely perpendicular to the surface of the substrate 100, but form an angle. The etching gas not only etches the substrate 100, but also etches the top of the protruding structures 1031. The width of the top of the protruding structures 1031 will decrease. The edges of the protruding pair will be removed, and the surface of the substrate 100 which is originally covered by the protruding structure 1031, will be exposed. Thus the size of the protruding pair is gradually reduced.

In the third stage, the etching gas is kept to etch the exposed surface of the substrate 100 and the plurality of protruding structures 1031, and the size of the protruding pair is reduced gradually to expose more surface of the substrate 100. Eventually, the plurality of three-dimensional nano-structure preforms 1021 is formed, and a groove 1041 is formed between the adjacent three-dimensional nano-structure preforms 1021. A cross section of each of the three-dimensional nano-structure preforms is substantially triangular. A cross section of the groove 1041 is in a shape of "V" or trapezoid.

In one embodiment, the etching gas includes $CH_xF_{4-x}$ and $O_2$, wherein X=0, 1, 2, 3. The power of the inductively coupled plasma device ranges from about 10 watts to about 150 watts, the flow speed of the etching gas ranges from about 8 sccm to about 150 sccm, the pressure of the etching gas can range from about 0.5 Pa to about 15 Pa, and the etching time can range from about 5 seconds to about 5 minutes. In another embodiment, the flow speed of the etching gas ranges from about 40 sccm to about 100 sccm in order to control the precision of the three-dimensional nano-structure preform 1021. In another embodiment, the etching gas includes $CF_4$ and $O_2$. The power of the inductively coupled plasma device is about 70 watts, the flow speed of the etching gas is about 40 sccm, the pressure of the etching gas is about 1 Pa, and the etching time is about 2 minutes. In the etching gas, the flow speed of the $CF_4$ is about 24 sccm, the flow speed of the $O_2$ is about 16 sccm. The angle of the triangular three-dimensional nano-structure preform 1021 can be selected according to a ratio between the flow speed of the $CF_4$ and the flow speed of the $O_2$.

The mask layer 103 and the etching gas are not limited as described above. The etching gas can include one gas or a mixture of different gases, so long as the tops of the two adjacent protruding structures 1031 in the mask layer 103 can be closed. The flow speed of the etching gas, the pressure, the etching time, and the ratio between the different gases can be dependent upon the three-dimensional nano-structure preform 1021.

In step (S14), the three-dimensional nano-structure 102 can be obtained by dissolving the residual mask layer 103. The mask layer 103 can be dissolved in a stripping agent such as tetrahydrofuran (THF), acetone, butanone, cyclohexane, hexane, methanol, or ethanol. In one embodiment, the stripping agent is butanone, and the mask layer 103 is dissolved in butanone and separated from the substrate 100. The mask layer 103 is removed to form the substrate 100 and the plurality of three-dimensional nano-structures 102 located on the substrate 100. The plurality of three-dimensional nano-structures 102 and the substrate 100 are integrated to form an integrated structure.

Figure 4:
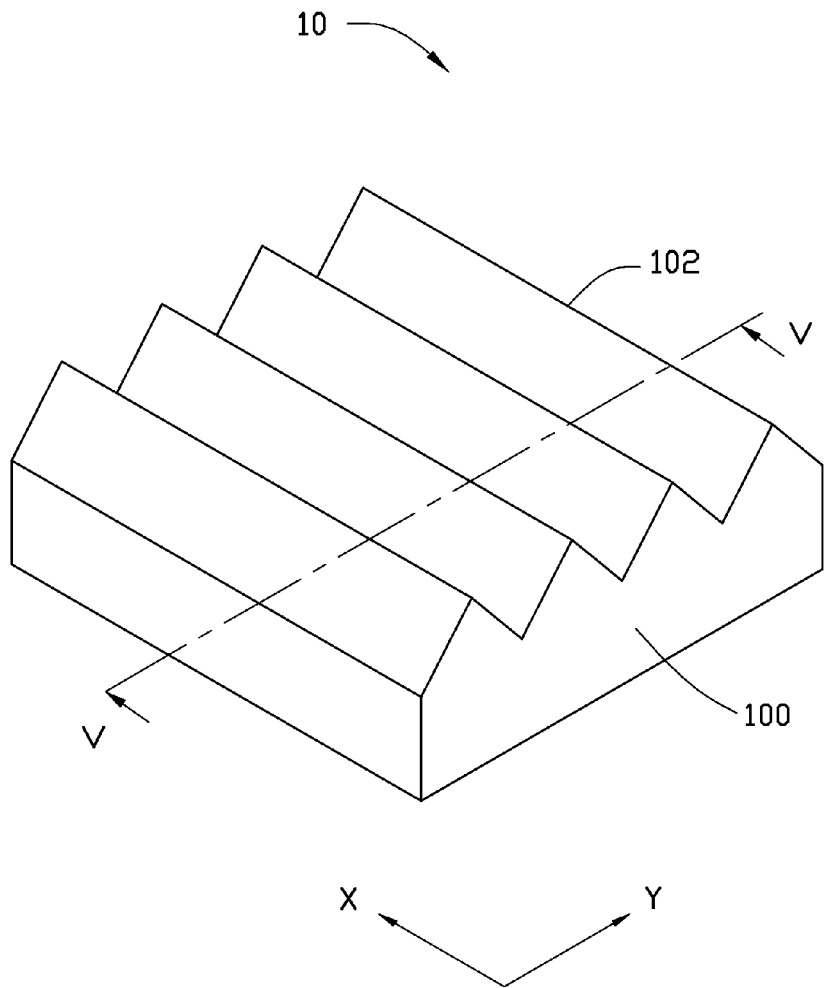
FIG. 4 is a schematic view of the grating made via the method of FIG. 1.
Figure 5:
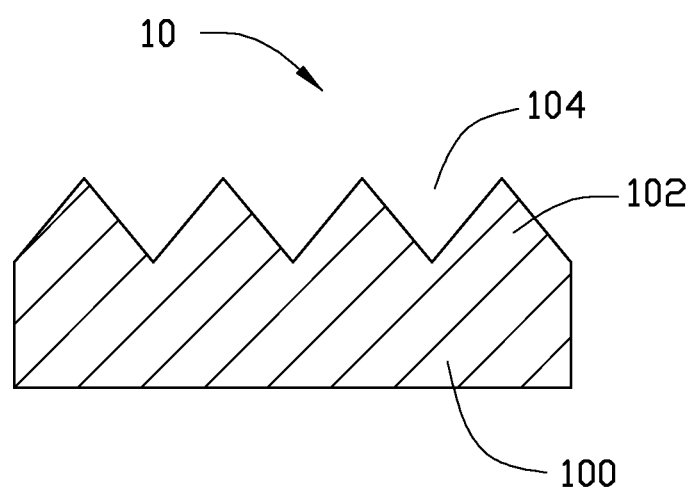
FIG. 5 is a cross-sectional view, along a line V-V of FIG. 4.
Figure 6:
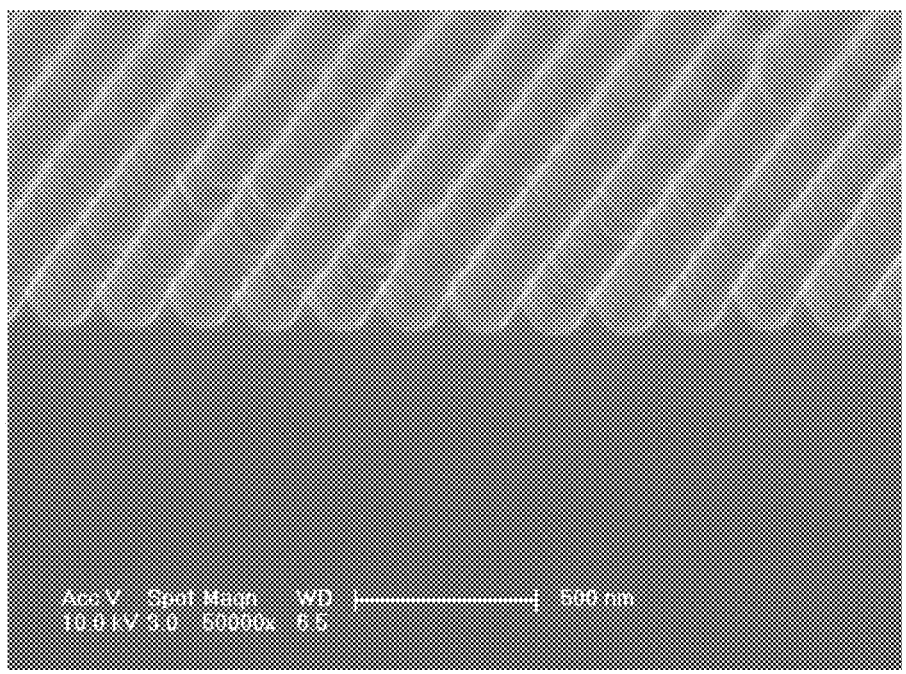
FIG. 6 is a scanning electron microscope (SEM) image of the grating of FIG. 4.

Referring to FIGS. 4-6, the plurality of three-dimensional nano-structures 102 extends along substantially the same direction and substantially parallel with each other. The groove 104 is formed between the adjacent three-dimensional nano-structures 102. A cross section of each three-dimensional nano-structure 102 along the X direction is triangular. In one embodiment, the cross section of the three-dimensional nano-structures 102 is in the shape of an isosceles triangle.

Figure 7:
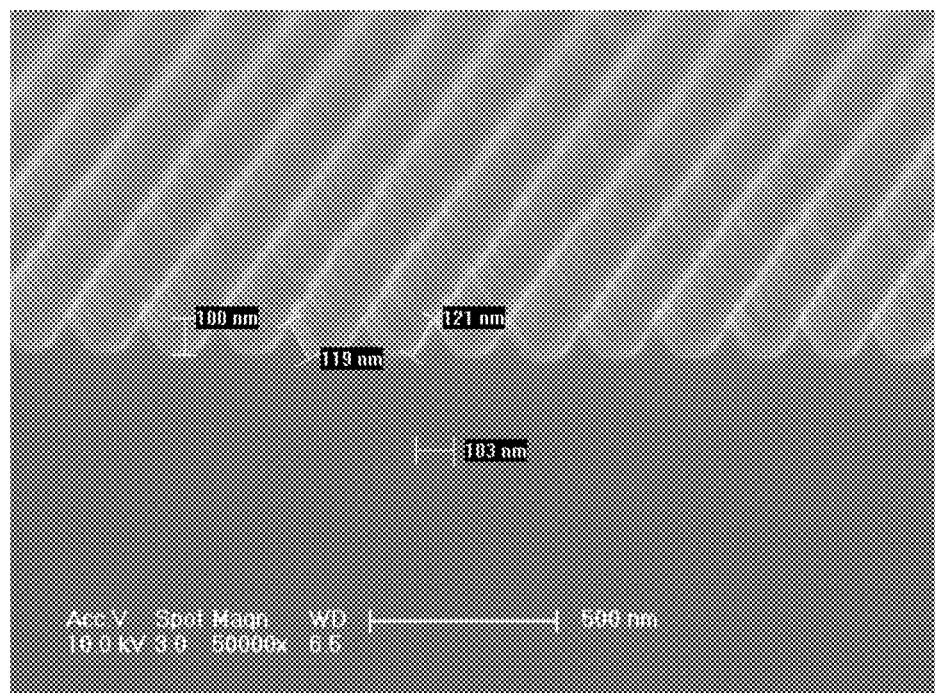
FIG. 7 shows parameters of the grating of FIG. 6.

Referring to FIG. 7, a period of the grating 10 is in nanoscale. In one embodiment, the period of the grating 10 ranges from about 50 nanometers to about 250 nanometers, such as 100 nanometers and 200 nanometers. An altitude of the isosceles triangular three-dimensional nano-structure 102 is about 100 nanometers. Lengths of the two side of the three-dimensional nano-structure 102 are about 119 nanometers and 121 nanometers respectively. Length of the base of the three-dimensional nano-structure 102 is about 200 nanometers. Thus the resolution of the grating 10 can be improved.

The method for making the three-dimensional structure has the following advantages. First, the second mask layer is made from the HSQ resist, which can be imprinted at room temperature, and the HSQ has small deformation in the subsequent manufacturing process, thereby ensuring the accuracy of subsequent etching. Second, the first mask layer is sandwiched between the substrate and the second mask layer, and the second mask layer will protect the first mask layer in the etching process to ensure good resolution of the first mask layer. Third, the nano-imprinting method can be carried out at room temperature, and the template does not need pre-treatment. Thus, the method is simple and low in cost. Fourth, during the process of etching the mask layer, each of two adjacent protruding structures are slanted face to face to form triangular protruding pair, the resolution and the precision of the grating can be improved. Fifth, the mask layer can be selected according to the material of the substrate to etch different kinds of substrates.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a grating, comprising:
   applying a mask layer on a surface of a substrate;
   forming a plurality of bar-shaped protruding structures to expose a portion of the substrate by patterning the mask layer, wherein the plurality of bar-shaped protruding structures extend along a direction substantially parallel with the surface of the substrate;
   etching the plurality of protruding structures so that each of two adjacent protruding structures begin to slant face to face until they contact each other;
   patterning exposed portion of the substrate to form a plurality of three-dimensional nano-structure preforms, wherein a cross section of each of the plurality of three-dimensional nano-structure preforms is triangular; and
   removing the mask layer.

2. The method of claim 1, wherein the each of two adjacent protruding structures gradually slant and tops of the each of two adjacent protruding structures gradually approach each other to form a protruding pair.

3. The method of claim 2, wherein the plurality of protruding structures is etched by an inert gas selected from the group consisting of argon, helium, and nitrogen.

4. The method of claim 2, wherein a portion of the top of each protruding structure is etched off, and a cross section of each protruding pair is triangular.

5. The method of claim 1, wherein the patterning exposed portion of the substrate is a plasma etching method comprising:
   forming a plurality of grooves with substantially the same depth by etching the surface of the substrate;
   exposing a portion of the substrate which is originally covered by the plurality of protruding structures, wherein a size of the plurality of protruding structures is gradually reduced; and
   forming a plurality of three-dimensional nano-structure preforms by etching the substrate.

6. The method of claim 5, wherein the substrate is etched by etching gas produced in an inductively coupled plasma device.

7. The method of claim 6, wherein a power of the inductively coupled plasma device ranges from about 10 W to about 150 W.

8. The method of claim 7, wherein the etching gas comprises $CH_xF_{4-x}$, and $O_2$, wherein X=0, 1, 2, 3.

9. The method of claim 8, wherein a flow speed of the etching gas ranges from about 8 sccm to about 150 sccm, a pressure of the etching gas ranges from about 0.5 Pa to about 15 Pa, and an etching time ranges from about 5 seconds to about 5 minutes.

10. The method of claim 8, wherein the etching gas comprises $CF_4$ and $O_2$, and a flow speed of the $CF_4$ is about 24 sccm, and a flow speed of the $O_2$ is about 16 sccm.

11. The method of claim 1, wherein a period of the grating is in nanoscale.

12. The method of claim 11, wherein the period of the grating ranges from about 50 nanometers to about 200 nanometers.

13. The method of claim 1, wherein the mask layer comprises a first mask layer and a second mask layer, wherein the first mask layer is sandwiched between the second mask layer and the substrate, and a material of the first mask layer is different from a material of the second mask layer.

14. The method of claim 13, wherein a thickness of the first mask layer ranges from about 100 nanometers to about 500 nanometers, and a thickness of the second mask layer ranges from about 100 nanometer to about 500 nanometers.

15. The method of claim 14, wherein a material of the first mask layer is ZEP520A, and a material of the second mask layer is HSQ.

16. The method of claim 13, wherein the patterning the mask layer comprises the following substeps:
   providing a template having a nano-pattern, wherein the nano-pattern comprises a plurality of protruding structures;
   attaching the template on the second mask layer;
   forming a plurality of slots in the second mask layer by pressing the template towards the second mask layer and removing the template;
   exposing the first mask layer by removing a residual second mask layer in the bottom of the slots; and
   exposing the substrate by etching the first mask layer corresponding to the slots.

17. A method for making a grating, comprising:
   locating a mask layer on a substrate, wherein the mask layer comprises a plurality of bar-shaped protruding structures, and a slot defined between each of two adjacent protruding structures of the plurality of protruding structures to expose a portion of the substrate;
   etching the plurality of protruding structures so that each of two adjacent protruding structures begin to slant face to face until they are contacting each other to form a protruding pair;
   etching exposed portions of the substrate through the slot to form a plurality of three-dimensional nano-structure preforms, wherein a cross section of each of the plurality of three-dimensional nano-structure preforms is isosceles triangular; and
   removing the mask layer.

18. The method of claim 17, wherein a cross section of the protruding pair is isosceles triangular or trapezium.

19. The method of claim 17, wherein a material of the substrate is silicon or quartz.

* * * * *